US008829556B2

(12) United States Patent
Aurongzeb et al.

(10) Patent No.: US 8,829,556 B2
(45) Date of Patent: Sep. 9, 2014

(54) THERMAL MANAGEMENT IN LARGE AREA FLEXIBLE OLED ASSEMBLY

(75) Inventors: Deeder Aurongzeb, Mayfield Heights, OH (US); James Michael Kostka, Cincinnati, OH (US); Gary Robert Allen, Chesterland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/223,935

(22) Filed: Sep. 1, 2011

(65) Prior Publication Data
US 2013/0056783 A1 Mar. 7, 2013

(51) Int. Cl.
*H01L 29/22* (2006.01)
*H01L 51/52* (2006.01)

(52) U.S. Cl.
CPC ........... *H01L 51/529* (2013.01); *H01L 51/5221* (2013.01); *H01L 2251/5361* (2013.01); *H01L 2251/558* (2013.01)
USPC ............... 257/99; 257/E33.066; 257/E33.075

(58) Field of Classification Search
CPC .............. H01L 51/529; H01L 51/5221; H01L 2251/5361; H01L 2251/558
USPC .............................. 257/99, E33.066, E33.075
See application file for complete search history.

(56) References Cited

U.S. PATENT DOCUMENTS

| | | | |
|---|---|---|---|
| 6,583,776 B2 | 6/2003 | Yamazaki et al. | |
| 6,819,316 B2 | 11/2004 | Schulz et al. | |
| 6,967,439 B2 | 11/2005 | Cok et al. | |
| 6,998,776 B2 | 2/2006 | Aitken et al. | |
| 7,045,438 B2 | 5/2006 | Yamazaki et al. | |
| 7,129,917 B2 | 10/2006 | Yamazaki et al. | |
| 7,141,489 B2 | 11/2006 | Burgener, II et al. | |
| 7,161,173 B2 | 1/2007 | Burgener, II et al. | |
| 7,172,813 B2 | 2/2007 | Burgener, II et al. | |
| 7,205,717 B2 | 4/2007 | Cok | |
| 7,205,718 B2 | 4/2007 | Cok | |
| 7,227,196 B2 | 6/2007 | Burgener, II et al. | |
| 7,344,901 B2 | 3/2008 | Hawtof et al. | |
| 7,393,598 B2 | 7/2008 | Caballero | |
| 7,407,423 B2 | 8/2008 | Aitken et al. | |
| 7,473,925 B2 | 1/2009 | Burgener et al. | |
| 7,534,700 B2 | 5/2009 | Yamazaki et al. | |
| 7,583,022 B2 | 9/2009 | Cok | |

(Continued)

FOREIGN PATENT DOCUMENTS

JP 2006 107755 4/2006
JP 2006196271 A 7/2006

(Continued)

OTHER PUBLICATIONS

Search Report and Written Opinion from corresponding International Application No. PCT/US2012/052051, dated Nov. 21, 2012.

*Primary Examiner* — Andy Huynh
(74) *Attorney, Agent, or Firm* — Fay Sharpe LLP

(57) ABSTRACT

A large area, flexible, OLED assembly has improved thermal management by providing a metal cathode of increased thickness of at least 500 nm. A thermal heat sink trace may be used as alternative or in conjunction with the increased thickness cathode where the trace leads from a central region of the OLED toward a perimeter region, or by other backsheet thermal management designs. External heat sinking, for example to a plate, fixture, etc. may be additionally used or in conjunction with the increased thickness cathode and/or backsheet design to provide further thermal management.

28 Claims, 4 Drawing Sheets

(56) References Cited

U.S. PATENT DOCUMENTS

| | | |
|---|---|---|
| 7,602,121 B2 | 10/2009 | Aitken et al. |
| 2001/0038098 A1 | 11/2001 | Yamazaki et al. |
| 2004/0032209 A1 | 2/2004 | Wu |
| 2004/0035360 A1 | 2/2004 | Yamazaki et al. |
| 2004/0080470 A1 | 4/2004 | Yamazaki et al. |
| 2005/0285518 A1 | 12/2005 | Cok |
| 2006/0132031 A1 | 6/2006 | Chang |
| 2007/0052634 A1 | 3/2007 | Yamazaki et al. |
| 2008/0030127 A1 | 2/2008 | Tsou et al. |
| 2009/0075411 A1 | 3/2009 | Yamazaki et al. |
| 2010/0294526 A1 | 11/2010 | Farquhar et al. |
| 2011/0147768 A1 | 6/2011 | Roberts et al. |
| 2011/0175523 A1 | 7/2011 | Kostka et al. |

FOREIGN PATENT DOCUMENTS

| | | |
|---|---|---|
| JP | 2007 284680 | 11/2007 |
| JP | 2008 289124 | 11/2008 |
| WO | WO 2005/083666 A2 | 9/2005 |

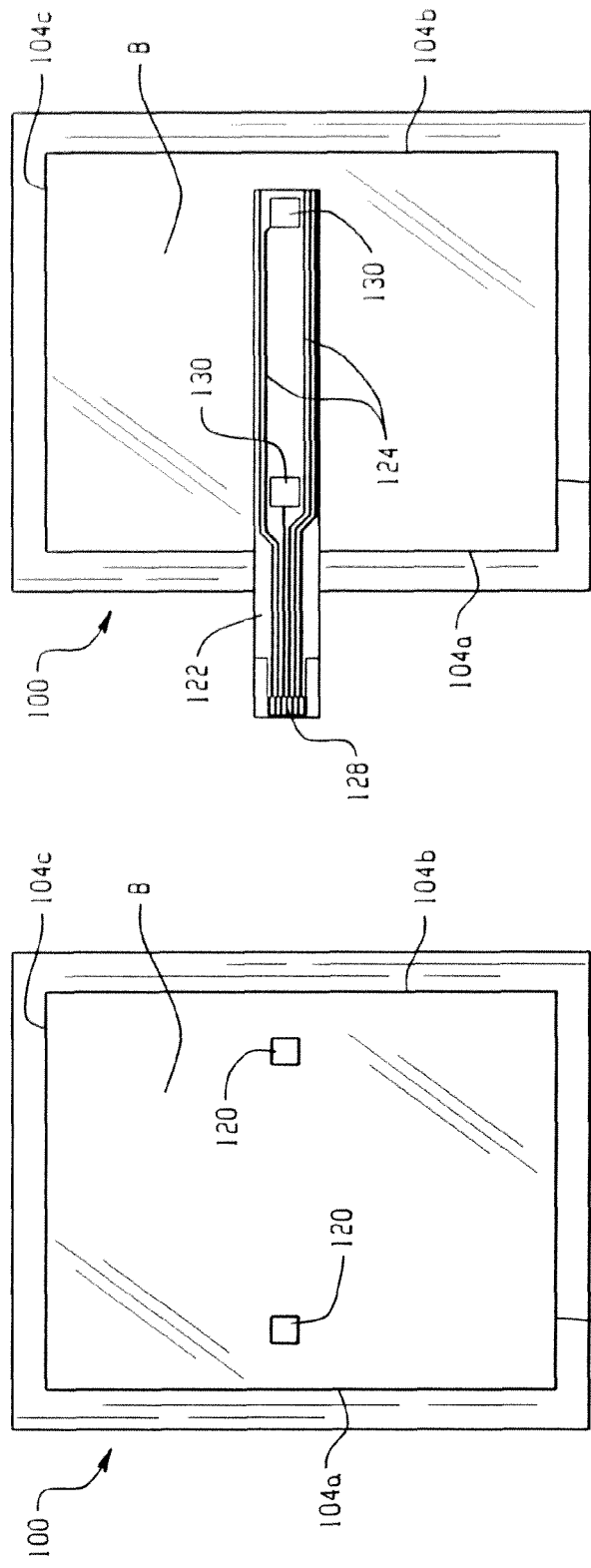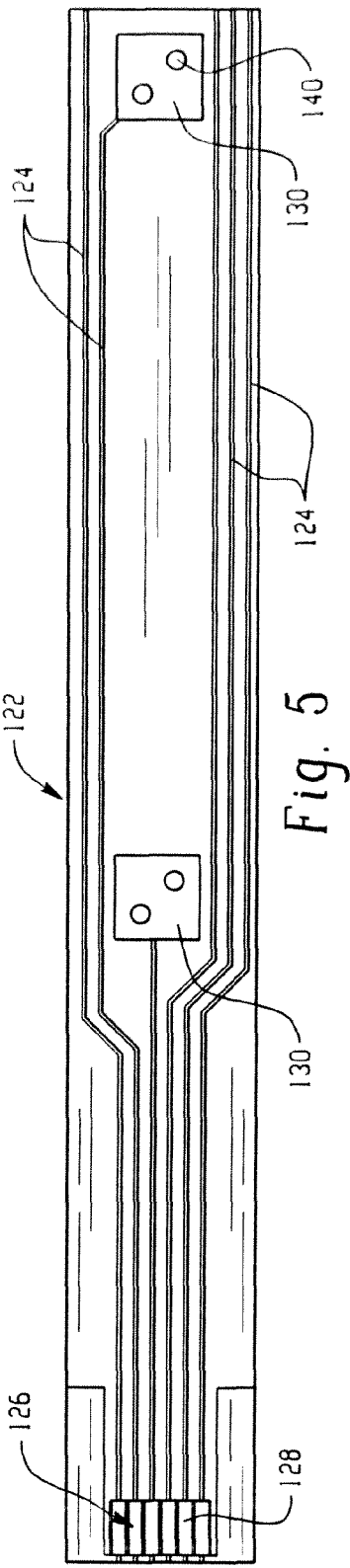

THERMAL MANAGEMENT IN LARGE AREA FLEXIBLE OLED ASSEMBLY

BACKGROUND OF THE DISCLOSURE

The present disclosure relates to a light source, and particularly a light source such as a light emitting device including an organic light emitting diode (OLED) panel. The disclosure more particularly relates to thermal management issues associated with large area, flexible OLED devices.

OLED devices are generally known in the art and typically include one or more organic light emitting layer(s) disposed between electrodes. For example, the assembly includes a cathode, organic layer, and a light-transmissive anode formed on a substrate so that the assembly emits light when current is applied across the cathode and anode. As a result of the electric current, electrons are injected into the organic layer from the cathode and holes may be injected into the organic layer from the anode. The electrons and holes generally travel through the organic layer until they recombine at a luminescent center, typically an organic molecule or polymer. The recombination process results in the emission of a light photon usually in the ultraviolet or visible region of the electromagnetic spectrum.

The layers of an OLED are typically arranged so that the organic layers are disposed between the cathode and anode layers. As photons of light are generated and emitted, the photons move through the organic layer. Those photons that move toward the cathode, which generally comprises a metal, may be reflected back into the organic layer. Those photons that move through the organic layer to the light-transmissive anode, and finally to the substrate, however, may be emitted from the OLED in the form of light energy. Some cathode materials may be light transmissive, and in some embodiments light may be emitted from the cathode layer, and therefore from the OLED device in a multi-directional manner. Thus, the OLED device has at least cathode, organic, and anode layers. Of course, additional, optional layers may or may not be included in the light source structure.

Cathodes generally comprise a material having a low work function such that a relatively small voltage causes the emission of electrons. Commonly used materials include a wide array of metals, however two commonly used cathode materials include aluminum (Al) and silver (Ag). On the other hand, the anode layer is generally comprised of a material having a high work function value, and these materials are known for use in the anode layer because they are generally light transmissive. Suitable materials include, but are not limited to, transparent conductive oxides such as indium tin oxide (ITO), aluminum doped zinc oxide (AZO), fluorine doped tin oxide (FTO), indium doped zinc oxide, magnesium indium oxide, and nickel tungsten oxide; metals such as gold, aluminum, and nickel; conductive polymers such as poly(3, 4-ethylenedioxythiophene) poly(styrenesulfonate) (PEDOT: PSS); and mixtures and combinations or alloys of any two or more thereof.

Preferably, these light emitting or OLED devices are generally flexible, i.e., are capable of being bent into a shape having a radius of curvature of less than about 10 cm. These light emitting devices are also preferably large-area, which means the OLED devices have a dimensional area greater than or equal to about 10 $cm^2$, and in some instances are coupled together to form a generally flexible, generally planar OLED panel comprised of one or more OLED devices, which has a large surface area of light emission (e.g., on the order of 70 $cm^2$ or greater).

OLED devices operating at 1 watt or greater, but preferably less than 60 W in a large area and generally having a thickness on the order of 800μ (i.e., flexible) or less encounter heating issues at high power. The heating unfortunately results in fast degradation of the OLED device. Consequently, a need exists for improved thermal management in order to increase life and performance.

Thermal management of plastic-based, flexible OLEDs is a particular challenge. It is common practice to use solution based processing techniques for plastic substrates when creating OLED devices, and they tend to not be as efficient as vapor-deposited, glass-substrate OLEDs. Consequently, more of the input power is lost as heat, and thus there is a more demanding need for dissipating that heat via thermal management designs. Additionally, in order to obtain an acceptable shelf life for plastic-based OLEDs, it is common practice to encapsulate the device in a secondary hermetic package. With the flexible OLED structures, dual layer encapsulation is desired in order to obtain the necessary barrier properties that protects against the adverse impact of oxygen and water vapor/moisture. Although the barrier properties are desired, this improved encapsulation creates thermal management issues for the flexible OLEDs. This package can trap the generated heat within the hermetic encapsulation, and so a thermal management scheme is needed for the device as well as the hermetic panel. Lastly, the heat needs to be removed from the panel, and this can be achieved by creating a heat sink to the fixture that contains the OLED panel. Therefore, there are three regions where thermal management designs must be implemented, and these thermal management designs must not adversely impact the flexible nature of the devices.

SUMMARY OF THE DISCLOSURE

An improved thermal management design is provided for large area, flexible OLED devices.

Thermal management features of the present disclosure include at least one of improved cathode thickness and/or materials, an improved backsheet design, and external heat sinking.

Preferably the cathode has a thickness of approximately 1000 nm, preferably no greater than 2000 nm.

The OLED assembly operates between a power range of approximately 1 W to less than 60 W, and more particularly from approximately 1 W to approximately 10 W.

The metal cathode preferably has a rigidity modulus less than 110 GPa, and more preferably a rigidity modulus that ranges between 15 and 110 GPa.

The metal cathode preferably has a thermal conductivity that ranges from approximately 1 to 430 W/mK, more typically approximately 20-400 W/mK.

Preferred cathodes are selected from metals that include silicon, tin, antimony, copper, nickel, molybdenum, and zinc, with aluminum and silver being the preferred metal cathode materials.

The cathode metals may he a mixture, combination, or alloy or may include a bi-layer or multiple materials that are distinct, separate layers.

Another thermal management solution includes backsheet designs that include high thermal conductivity adhesive and large areas of exposed metallic foils that aid in removing the generated heat that is trapped in the hermetic panel. This is achieved by convection with the external environment, or conduction through a heat sink in the fixture design.

Still another feature of the thermal management solution is to provide for external heat sinking, for example to a plate, fixture, etc.

A primary benefit of the present disclosure is the provision of a high thermal conductivity pathway for the OLED device, through the hermetically sealed package, and into an associated fixture where the heat can be effectively dissipated.

Another benefit is longer life for the OLED device.

Still another benefit is thermally managing the OLED panel without adversely affecting its flexible nature.

Yet another advantage relates to improved performance of the OLED device as a result of transferring heat away from the device.

Still other benefits and advantages will become apparent to one skilled in the art upon reading and understanding the following detailed description.

BRIEF DESCRIPTION OF THE DRAWINGS

FIG. 3 is a plan view of a rear surface of the OLED assembly.

FIG. 4 is a plan view of the rear surface of the OLED assembly with connector cable.

FIG. 5 is an enlarged plan view of a preferred flat flexible cable.

DETAILED DESCRIPTION OF THE PREFERRED EMBODIMENTS

For purposes of the following description, particular details of a generally planar, flexible light source or OLED device are generally known to those skilled in the art. Therefore, further description herein is deemed unnecessary to a full and complete understanding of the present disclosure. Those details required for the present disclosure are provided below and illustrated in the accompanying drawings. As used herein, the term "lighting assembly" refers to any assembly of all or some of the components materials described herein, including at least a light source, which may be an OLED device or a panel including at least one hermetically sealed OLED device, and a connector cable for providing electrical power to the assembly. Although the preferred arrangement the light assembly is a large area, flexible light assembly, selected aspects may find application in other lighting solutions.

Figure 1:
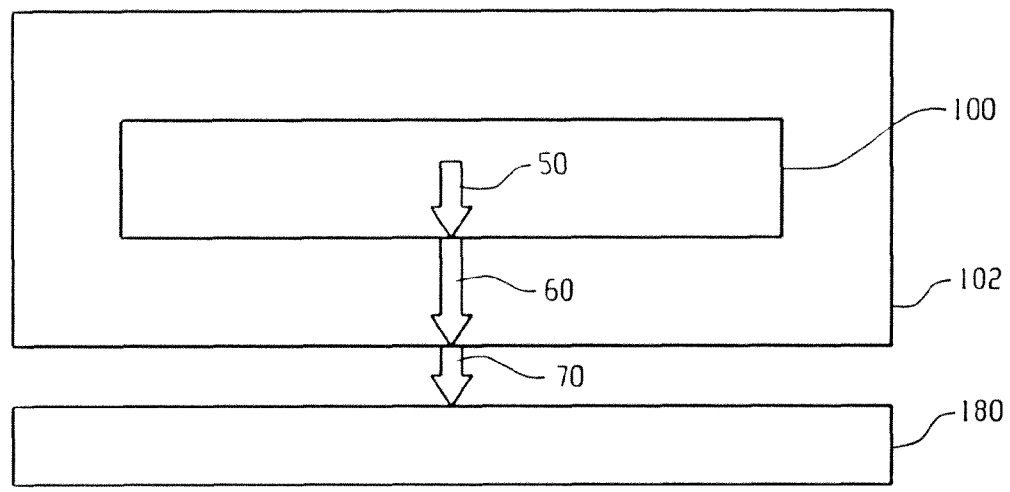
FIG. 1 is a cross-sectional view of a large area, flexible OLED panel system.

Turning initially to FIG. 1, there is generally shown the thermal management needs of a flexible OLED system. First, the OLED device is hermetically sealed in a package to form the OLED hermetic panel. Therefore, as noted above, there is a need to transfer or convey heat 50 from the OLED device to the panel. Likewise, a second area of thermal management relates to conducting heat 60 from the panel. Last, another region to improve thermal conductivity represented by reference numeral 70 is at the fixture.

Figure 2:
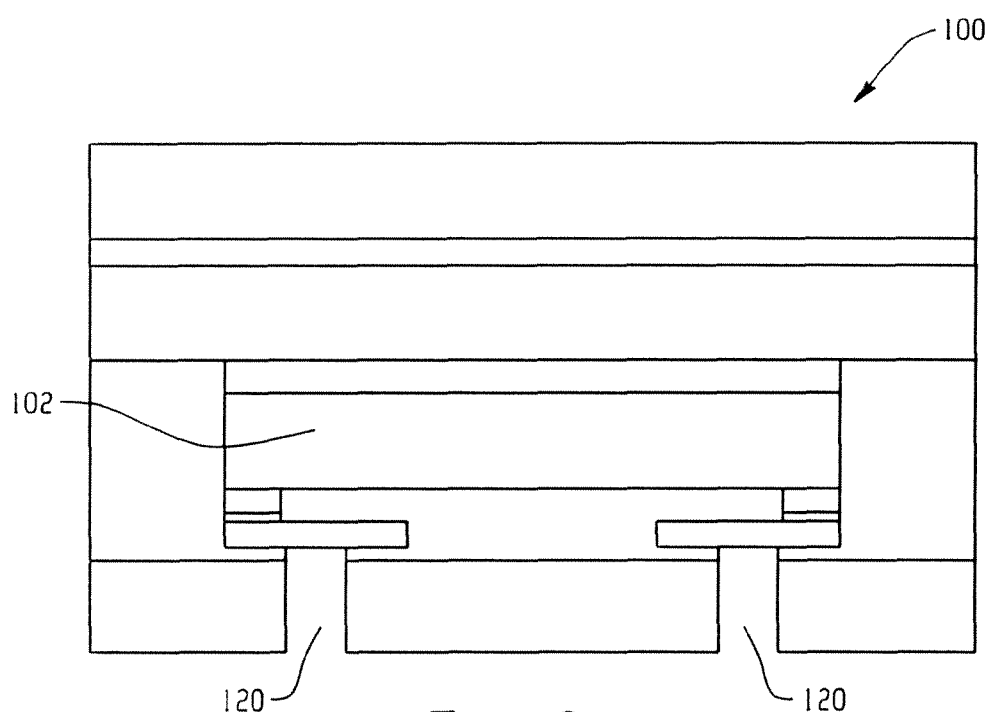
FIG. 2 is a cross-sectional view of an OLED panel.

In FIG. 2, there is shown a cross-sectional view of a flexible light assembly or OLED panel 100 that includes a light source or OLED 102 that in this embodiment is covered on a light emitting side by an optical coupler layer OC and an ultra high barrier film UHB that is transparent and laminated on top of the OLED device. The UHB barrier film creates a hermetic package by sealing to an impermeable backsheet B by means of barrier adhesive BA. An out-coupling adhesive OCA also bonds an outcoupling film OF to the outer surface of the UHB. The rear surface of the OLED assembly includes ACF strips and a supplemental bus interposed between the OLED 102 and the backsheet B. The backsheet is typically made of an oxygen and water vapor impermeable material, such as a lidding foil. One example of a lidding foil is Tolas TPC-0814B, which is a multi-layer barrier material available commercially from Oliver-Tolas Healthcare Packaging, although other commercially available products may be used without departing from the scope and intent of the present disclosure. Such barrier materials generally comprise a multi-layer composite, which has a relatively thick (approximately 25 micrometers) layer of metal foil in the innermost layer. The metallic layer provides the backsheet with excellent barrier properties, and also allows for flexible applications.

Adhesively securing the OLED 102 to the UHB and backsheet prevents the trapping of gas during the lamination process. Without the adhesive, pockets of gas can potentially be trapped during the lamination process, and these gas pockets can move around within the hermetic panel when in flexed applications, which leads to unwanted stresses and potential delamination defects. It is also not aesthetically pleasing to have a gas bubble trapped in the panel. Having adhesive disposed over the entire UHB film (internal to the package) and having adhesive over the entire backsheet (except where electrical contact is made with the OLED) is preferred. The adhesive could be thermoplastic, thermosetting, pressure sensitive adhesive (PSA), or a combination.

Electrical contact patches P are provided on apertures in the backsheet to allow electricity to be passed into the hermetic panel from an external source to the OLED device. These patches P can be located either on the internal or external surface of the backsheet. The external surface of the contact patch allows one to make an electrical connection to an external circuit. One design includes using a flat flex cable, as described in commonly owned, co-pending U.S. application Ser. No. 12/644,520, filed Dec. 22, 2009.

With continued reference to FIG. 2 and additional reference to FIGS. 3-5, the flexible light assembly or panel 100 includes the light source supported at least in part by the back panel shown here as a first generally planar, surface B that has a perimeter or edge 104. The perimeter edge 104 has a generally quadrilateral conformation or rectangular conformation in which opposite edges are preferably disposed in substantially parallel relation in the illustrated embodiment. However, the present disclosure need not necessarily be so limited. Here, edges 104a, 104b are parallel and edges 104c, 104d are likewise parallel.

The backsheet B is preferably formed from an air and moisture impervious material. The backsheet provides support for the light emitting device and, in one preferred embodiment, has a surface area that substantially covers one side or surface of the light source. It is also contemplated that the impermeable backsheet B is light impermeable in the preferred arrangement, i.e., light is emitted from the enlarged, generally planar surface opposite the backsheet B, but one skilled in the art will recognize that in other instances the backsheet may be light transmissive and the backsheet may therefore also be a light emitting surface.

Perimeter edges of the light source 102 and the backsheet B are preferably hermetically sealed. Thus, the edge of the light emitting device 102 is sealed about its entire periphery by a barrier adhesive BA (FIG. 2) or by an extension of the backsheet. In some instances, the backsheet is co-terminus with the dimensions of the light emitting surface while in other instances the backsheet has an open-centered, frame-like structure that seals about generally annular perimeter portions as more particularly shown and described in commonly owned, co-pending U.S. application Ser. No. 12/691,674, filed Jan. 12, 2010.

At selected locations in the light panel, at least one and preferably multiple electrical feedthrough regions 120 (FIG. 3) are provided for communication with the individual OLED devices that constitute a light panel. These electrical feedthrough regions 120 are typically spaced inwardly of the perimeter. Therefore, an effective electrical connection with an external driver circuit (not shown) is desired, and one solution is to provide a generally planar or flat, flexible cable 122 that interconnects the external circuit with patches P that cover the feedthrough regions 120. Electrically conductive traces 124 are provided in the flexible cable and extend from a standard connector, such as a zero-insertion force connector 126 at or adjacent one end of the cable. The connector preferably has exposed, electrically conductive portions 128. Suitable connection can be made with the external circuit via the connector 126 and electrical current is thereby provided for the traces 124 to one or more electrically conductive pads 130 (FIG. 4) provided in the cable. Likewise, the flexible cable 122 has a sufficient dimension so that the connector 126 is located outside a perimeter of the OLED panel where connection can be made with the associated external circuit. A preferred flat, flexible cable has a thickness on the order of approximately 10 mils or less so that it does not adversely interfere with the desired flexible nature of the OLED panel. More particular details of the flexible cable used to establish electrical connection to the OLED device are found in commonly owned, co-pending U.S. application Ser. No. 12/644,520, filed Dec. 22, 2009.

The patches P are preferably formed of a material that exhibits high bond strength to the low temperature solder contemplated for use in desired embodiments. Aluminum is conventionally used in conjunction with silver epoxy or double-sided conductive tape adhesives. Alternatively, silver, tin, or copper may be used as a patch material, or combinations of one or more of these material such as a tin-coated copper. In this manner, desired properties of one or more materials may be advantageously combined such as a tin-coated copper patch exhibiting desired strength.

Figure 6:
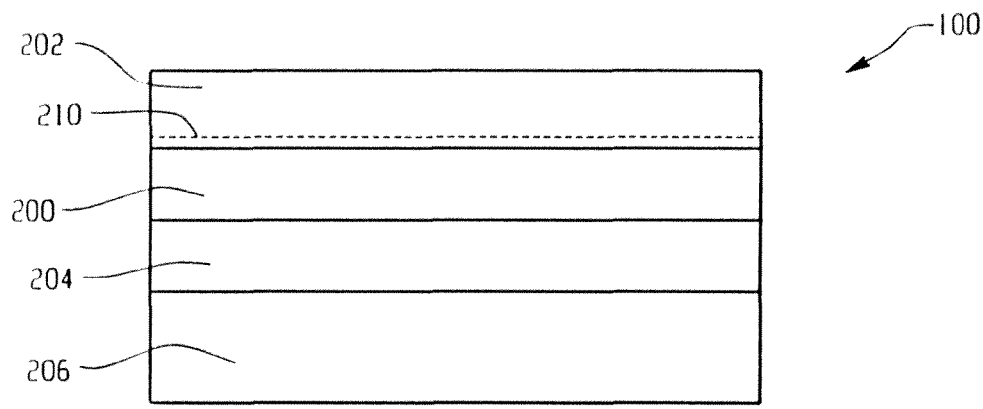
FIG. 6 is a cross-sectional of an OLED device.

As noted above, heat generation at high current densities is believed to shorten the life of the OLED devices. Therefore, improved thermal management is required to transfer heat away from the device. For example, since the cathode is typically formed of a metal, when encased in a polymer plastic, and increased current is introduced through the cathode, the OLED generates substantial heat. Three proposed solutions for improved thermal management are addressed here, any one of which addresses thermal management and with the understanding that any two can be used in combination or all three may be used together. FIG. 6 is a basic conceptual drawing of the OLED device 100 in which an organic layer 200 is received between the cathode 202 and anode 204, and received on a substrate 206.

With regard to the thermal management of the OLED device, a first thermal management aspect is to manipulate the cathode 202 itself Typically, the cathode has a thickness on the order of 100 nm. It is proposed to make the cathode up to 500 nm thick, and possibly between 1000-2000 nm thick. Generally, the limit for the cathode thickness is between 500 nm and 1000 nm where the constraint regarding the thickness of this layer relates to the reality of the manufacturing process. That is, a vapor deposition process is typically used to put down the cathode layer and applying extremely thick materials would take a long time. For a single layer cathode, a 500 nm or greater thickness provides a means to manage the thermals in the device. Further, thermal management is at least in part dependent on the material used to construct the cathode, or in some instances the cathode is formed of multiple materials or metal alloys, or the cathode may have distinct, separate layers, of varying thickness. For example, preferred metal cathode materials include the group of silicon (Si), tin (Sn), antimony (Sb), copper (Cu), nickel (Ni), molybdenum (Mo), aluminum (Al), silver (Ag), and zinc (Zn). In addition to the thickness of the cathode, the cathode selection may be based in part on thermal conductivity or rigidity modulus. The following table illustrates the thermal conductivity and rigidity modulus, of cathodes that could be used in OLED devices of large area, flexible assemblies.

| Metal | Thermal Conductivity (W/mK) | Rigidity Modulus (GPa) |
|---|---|---|
| Silicon (Si) | 150 | 110 |
| Tin (Sn) | 67 | 18 |
| Antimony (Sb) | 24 | 20 |
| Nickel (Ni) | 91 | 76 |
| Molybdenum (Mb) | 139 | 20 |
| Zinc (Zn) | 120 | 43 |
| Copper (Cu) | 401 | 48 |
| Aluminum (Al) | 236 | 26 |
| Silver (Ag) | 430 | 30 |

As is evident from the table, the cathode 202 may have a thickness of approximately 500 nm, and may range in thickness from approximately 1000 nm to preferably no greater than approximately 2000 nm. These thicknesses are associated with operating the OLED between a range of approximately 1 W to less than 60 W, and more preferably in a range from approximately 1 to approximately 10 W. Further, the rigidity modulus may range from approximately 15 (tin) to approximately 110 (silicon) GPa to ensure flexibility of the OLED device. Still further, the thermal conductivity may range from approximately 20 (antimony) to 430 (silver) W/mK.

The preferred thickness t and thermal conductivity k of the cathode 202 can be understood from the following description of the heat dissipation from the cathode 202 to the ambient air. There are two primary heat loads. First, there is an approximately uniform heat load due to the losses in the conversion of electrical power to light at all locations in the organic layer(s). Second, there is a localized heat load due to ohmic losses at the electrical contact points between the cathode 202 and the electrical patches 120 and the electrically conductive pads 130, or wherever other anomalous losses occur locally.

The uniform heat load generally does not overheat the OLED structures. The thermal circuit from the organic layer(s) to the ambient typically consists of two primary portions. The first portion of the thermal circuit is characterized by thermal conduction through the solid, outwardly away from the organic layer(s), across the plane of the OLED layer(s), for example across the thickness of the cathode 202, to the outside surface of the OLED. The second portion of the thermal circuit is typically the dissipation of heat from the outside surface of the OLED layer(s), having surface area $A_O$, by convection to ambient air. Equation 1 expresses the thermal power conducted through each solid layer of the OLED.

$$\Delta T = (P/A_O)*(t/k) \quad (1)$$

The power density of an OLED is typically about 1 Watt per 0.01 so $P/A_O \sim 100$ W/m$^2$. The allowable temperature increase $\Delta T$ of the organic layer relative to the ambient temperature is up to about 40-60 K. If some fraction of that increase, for example 10 K, can be allocated to any single element in the thermal path, for example the cathode 202 itself, then the allowable maximum ratio of the thickness t to the thermal conductivity k of the cathode 202 can be estimated to be t/k=0.1 K m$^2$/W. For a typical value of k~100 W/m-K, the allowable thickness is t<10 m. So, indeed the temperature rise due to the uniform heat dissipation is negligible, and does not create a limit on the thickness or thermal conductivity of the cathode 202 or any of the other planar OLED layers having similar dimensions. Even for a value of k~0.1 W/m-K, the allowable thickness of a layer is any t<10 mm.

Equation 2 expresses the thermal power dissipated by free convection to ambient air.

$$\Delta T = (P/A_O)*(1/h) \quad (2)$$

The convection coefficient h for flat surfaces in contact with air varies as a function of vertical or horizontal orientation, surface figure, and other factors, but is typically ~10 W/m$^2$K. For the typical case of $P/A_O \sim 100$ W/m$^2$, the result of Equation 2 is $\Delta T \sim 10$ K, which is generally an allowable temperature increase above ambient for the OLED. The results of Equations 1 and 2 indicate that the heating of the OLED due to uniform heat loading ~100 W/m$^2$ results in a uniform temperature increase of the OLED relative to ambient air of ~10 K, limited by free convection to ambient air, as long as none of the OLED layers has a ratio of t/k<0.1 K m$^2$/W. This typically allows for thickness t up to as much as 10 mm even for k as small as 0.1 W/m-K. The uniform heat load generally does not overheat the OLED structures.

However, the second type of heat load, the localized heat load due to ohmic losses at the electrical contact points or other non-uniform dissipation of power, can overheat the OLED if the thermal management is not sufficient. This type of problem can be calculated precisely in computer models, and measured in actual devices. But a simple geometric approximation, similar to that for the uniform heat load, can provide insight into the magnitude of the problem and the effectiveness of thermal management solutions. Equation 2 still applies, with the substitution of total OLED power P by the local hot spot power $P_{local}$. But Equation 1 must be replaced by Equation 3, where the limiting thermal conduction path is no longer the thickness t across the layer(s), but rather is determined by the need to spread the heat away from the hot spot, parallel to the OLED layer(s) along a length L.

$$\Delta T = (P_{local}/A_X)*(L/k) \quad (3)$$

The length L across which the heat must be conducted is much longer than the thickness t, and the cross-sectional area AX through which the heat is conducted is much less than the surface area $A_O$, of any given OLED layer(s), for example the cathode 202. So, the requirement on thickness t and thermal conductivity k of the OLED layer(s) are much more demanding than for the uniform heat load. Since the case of uniform heat load generates a temperature increase ~10 K on the OLED relative to ambient air, and since an additional temperature rise due to local heating should be limited to an additional ~10 K, or at most ~50 K, then the heat from the local hot spot must be dissipated by convection to air over a relatively large surface area $A_S \sim L^2$. The effective cross-sectional area of the OLED layer, for example the cathode 202, through which the heat is conducted away from the hot spot is $A_X \sim t*L$. Then Equation (3) simplifies to Equation (4), which is independent of L, as expected.

$$\Delta T \sim P_{local}/(t*k) \quad (4)$$

Again, considering the case of a 1 W OLED, where the heat generated in the local hot spot is 0.1% of the total heat generated in the entire OLED, or 0.001 W, and the allowable $\Delta T$ is ~10 K, then t*k>0.0001 W/K is required. For example, if k~100 W/m-K, then t>10$^{-6}$ m=1 micron is required. Although the above estimates are precise only within about an order of magnitude, it is demonstrated that the value of k should be ~100 W/m-K or greater, or a significant fraction of 100 W/m-K, and the value of t should be ~1 micron, or greater, or a significant fraction of 1 micron, in order to limit the additional heating at a local hot spot to ~10 K, or at most ~50 K, for the case where the non-uniformity of the heating is ~0.1% of the total OLED power, which might represent a typical ohmic loss at the electrical contacts, for example.

In a preferred embodiment, the cathode 202 is constructed in a bi-layer fashion (as represented by the dashed line 210 in FIG. 6. The layer closest to the functional organic layers 200 within the OLED 100 is constructed of a thin, preferably <50 nm layer, Al or Ag, and the remainder of the cathode, up to 2000 nm but more preferably around 450 nm, is constructed from a different material from the table. By having a bilayer cathode, one is able to maximize the electron injection properties and/or reflective properties by choosing a compatible material for the thin inner layer, in addition to being able to separately tailor the thermal conductivity and flex capabilities of the cathode with the thick outer layer.

In some instances it is beneficial to cover the majority of the cathode of the OLED device with a protective cover. This protective cover prevents handling damage and can also provide an additional oxygen and moisture barrier. If a protective cover is utilized, it is also beneficial to ensure that the generated heat in the OLED device can be transferred through that layer as well. This can be accomplished by choosing to make the protective cover out of materials that have high thermal conductivity. Preferably the protective cover is an electrical insulator, exhibits thermal conductivities greater than 5 W/(mk), and has a thickness of less than 75 micrometers.

Figure 7:
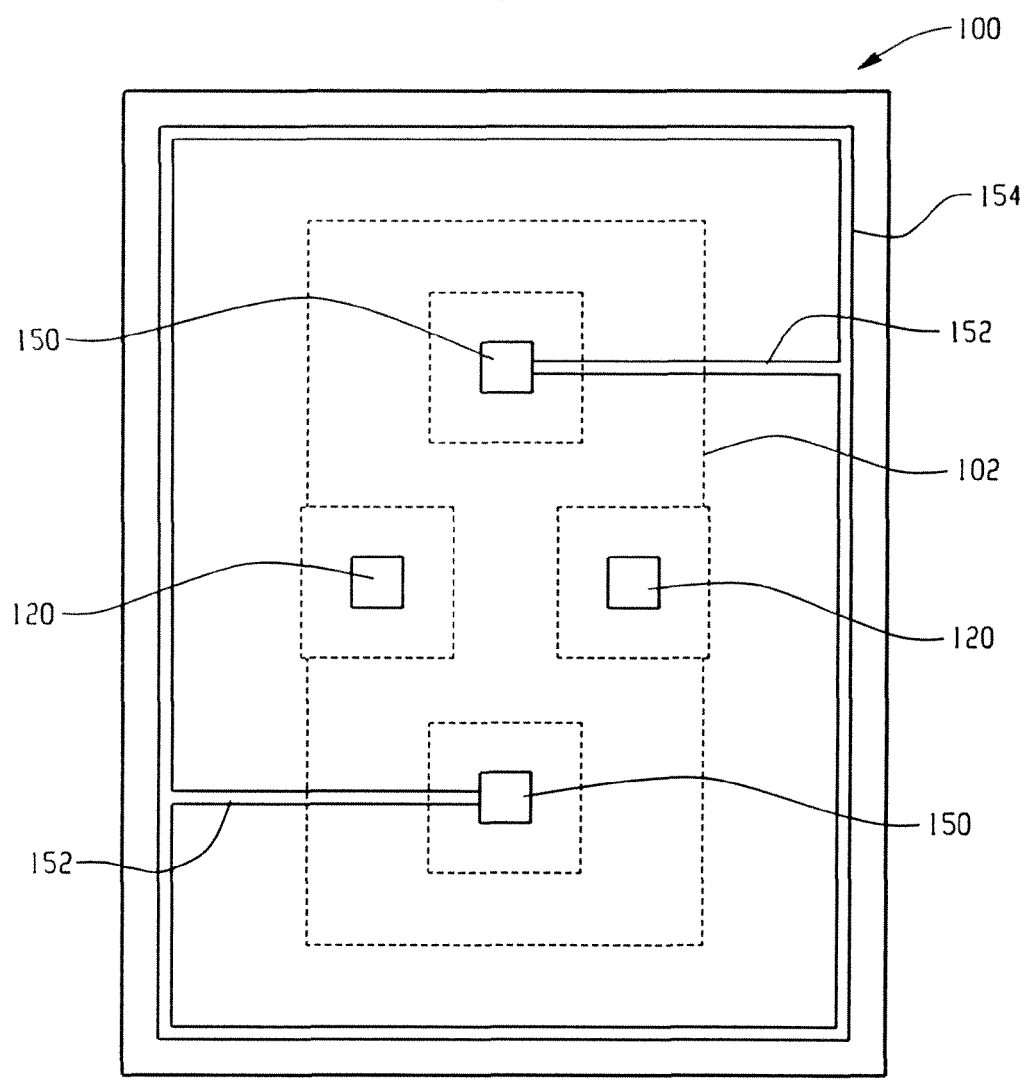
FIG. 7 is a plan view of a rear surface of a backsheet of a large area, flexible OLED panel.

It is preferable to encase or hermetically seal the OLED assembly. Of course, this only contributes to trapping heat within the device and therefore other thermal management considerations are desirable. FIG. 7 illustrates one manner of directing heat transfer to a perimeter by way of a heat dissipation trace. More specifically, the backside of the OLED panel illustrates electrical feedthroughs 120 that are used with the flexible cable 122 (removed for ease of illustration in FIG. 7) and that interconnect with an associated drive circuit. Electrically isolated, and preferably dimensionally spaced from the electrical feedthroughs are additional feedthroughs referred to as thermal sink feedthroughs 150. The thermal feedthroughs are preferably spaced inwardly of the perimeter and are formed of a thermally conductive material in order to convey heat from a central portion of the backside of the OLED panel via traces 152 that interconnect the thermal sink feedthroughs 150 with a perimeter heat dissipation trace 154. The representation in FIG. 5 is just one preferred arrangement of the thermal sink feedthroughs, interconnecting traces, and heat dissipation traces. That is, one skilled in the art will recognize that other designs can be used without departing from the scope and intent of the present disclosure. The heat dissipation traces are preferably located along the perimeter of the OLED panel where the traces are in thermally conductive relation with an associated fixture (not shown) to convey away as much heat as possible that is generated by operation of the OLED device. The traces form a pathway to convey heat from the central portion of the panel and into the fixture where the heat is effectively dissipated by convection to the surrounding environment or the large thermal mass of the fixture will be sufficient to serve as an effective heat sink.

A preferred material to assist with thermal conduction is a high thermal conductivity adhesive, for example, commercially available adhesives that exhibit a thermal conductivity of approximately 1.0-5.0 W/mK. The adhesive may be utilized to more effectively transfer heat out of the system where adhesive bonding is necessary. Examples of where the adhesive may be located include, but are not limited to, between the light emitting device and the thermal feedthroughs 150, between the thermal feedthroughs 150 and the trace 152, and between the traces 152/154 and the thermal sink fixture. The number, size, and location of thermal feedthroughs can be optimized based on the device or the end use/application. The traces shown in FIG. 5 transfer the heat away from the OLED device, toward the edge seal region. Again, the trace dimensions and designs can also be optimized for the device/application. It is even contemplated that traces may not be needed if the OLED panel can be effectively heat sinked to the fixture itself via the thermal feedthroughs. However, at least in some applications, it would likely be advantageous to simply move the heat toward the edges the panel and away from the OLED devices.

The high thermal conductivity of the adhesive on the backside of the OLED device effectively transfers the heat away from the device to the metal patch thermal feedthroughs. The adhesive has a thermal conductivity that is about an order of magnitude higher than that of typical polymers, and so the adhesive should effectively transfer the heat to the thermal feedthroughs.

Since the adhesive is thin (on the order of approximately 10-100 μm) and flexible, the use of the thermally conductive adhesive does not adversely impact on the desire to provide a flexible, thin OLED panel. Further, it is preferable that the OLED devices are adhered to the backsheet for mechanical reasons. For example, air pockets are not desirable in the OLED assembly. Therefore, the adhesive can serve the added function of mechanically adhering the OLED device to the backsheet for those designs that do not already have an adhesive on the backsheet.

The traces illustrated in FIG. 7 are also preferably made of thin, thermally conductive material, such as those presented in the Table. The thickness range is from approximately 10-100 μm, and the traces are adhered to the external surface of the backsheet using conventional adhesives. The width of the traces can vary depending on the size and power of the OLED, but widths of 1-15 mm are common. These material and geometry characteristics will allow effective heat dissipation without inhibiting the flexibility of the device.

Figure 8:
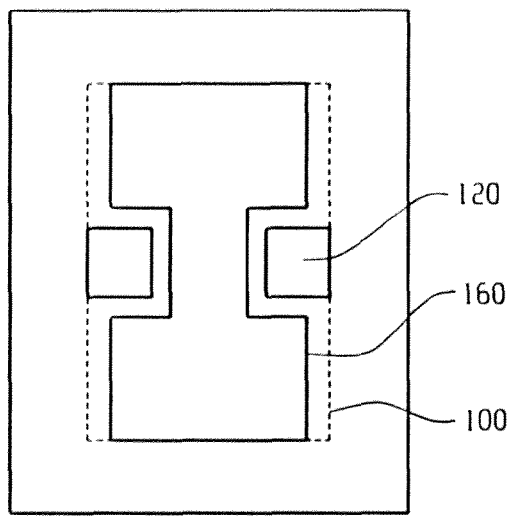
FIGS. 8-9 are plan views of front and rear surfaces, respectively, of the backsheet of the OLED panel.
Figure 9:
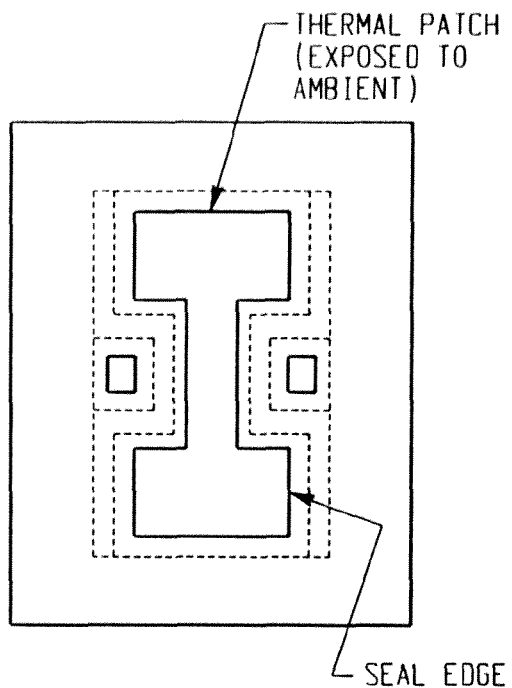

Embodiments illustrated in FIGS. 8-9 and 10-11 show two more thermally managed backsheet designs for the OLED assembly. For example, the thermal contact patches 160 shown in FIGS. 8-9 illustrate how the thermal contact patches can be substantially enlarged to provide support for substantially the entire backside of the OLED. This enlarged patch eliminates stress concentrations that arise in designs where electrical patches only are provided to electrically connect the OLED panel through the backside as taught in, commonly owned, co-pending U.S. application Ser. No. 12/644,520. More importantly, this large metallic surface that is coupled to the OLED device with thermally conductive adhesive is also exposed on the external surface. This allows a large surface area for convection to dissipate heat generated in the panel, as a large area pathway of thermally conductive material is incorporated from the device to the outside environment. For effective thermal management the exposed metal on the backside should be at least 30% of the area of the light emitting device that is internal to the panel. Again, thin, thermally conductive materials will preferably be utilized as previously described in the application. There is still a need to electrically isolate the electrical feedthrough patches from the thermal contact pads 160 as evidenced by the spacing between the structures in FIG. 8-9. This prevents the OLED device from shorting to the thermal patch, which is only thermally conductive, but oftentimes is formed from a material that is electrically conductive also.

Figure 10:
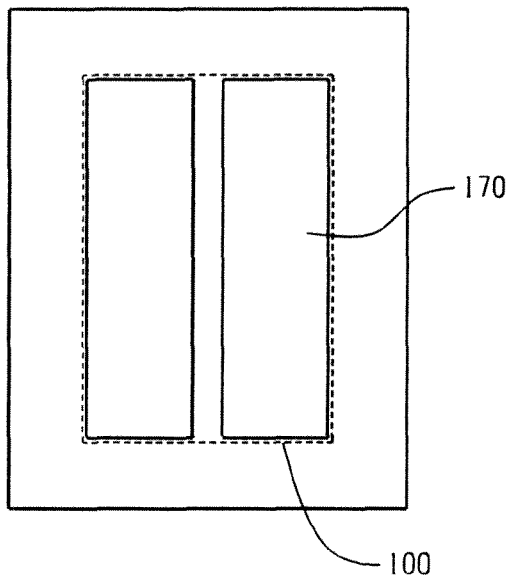
FIGS. 10-11 are plan views of front and rear surfaces, respectively, of he backsheet of the OLED panel in another preferred arrangement.
Figure 11:
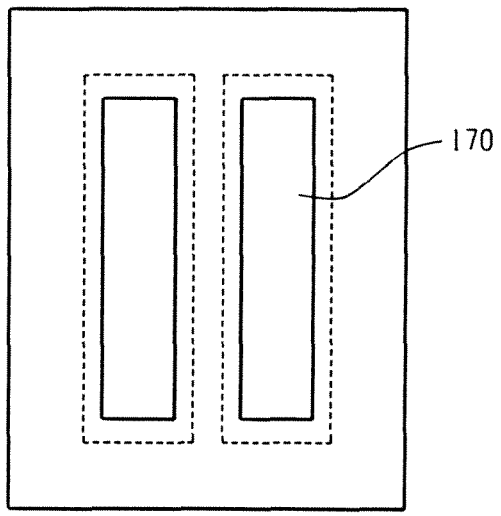

In FIGS. 10-11, in an alternative arrangement, the electrical feedthroughs are enlarged for use as thermal sinks while still supporting the majority of the OLED panel. Thus, a combined electrical/thermal patch 170 is provided and shown here as a pair of patches that are dimensionally spaced or electrically isolated from one another. The combined electrical/thermal patches cover a substantial portion of the surface area of the OLED panel. This provides the desired mechanical support, and also serves as an enlarged heat sink. It is contemplated that there may be multiple openings in the backsheet to connect and transfer heat or provide electrical continuity as required by the design.

As shown in FIG. 1, a third area of thermal management is achieved with heat sinking to a fixture/plate 180. Once heat is removed from the panel via the above described arrangements, convection on the external surface, or preferably a heat sink is provided such as fixture 180, such that conduction into a large thermal mass and convection are enhanced. Preferred fixture/plate materials are shown in the Table. The required thermal mass and exposed surface area of the fixture/plate to dissipate the generated heat is highly dependent on the application, and can be determined by considering numerous factors such as the number of light emitting devices, the operational power of the devices, the efficiency of the devices, the thermal conductivity of the fixture/plate, and the efficiency of the specific device thermal management and panel thermal management schemes utilized.

The present disclosure has been described with reference to the preferred embodiments. Obviously, modifications and alterations will occur to others upon reading and understanding the preceding detailed description. It is intended that the disclosure be construed as including all such modifications and alterations.

What is claimed is:

1. A large area, flexible, organic light emitting device (OLED) assembly comprising:
   a large area, flexible OLED encased in a barrier over at least a rear surface of the OLED; and
   a thermal management arrangement for the OLED including a feedthrough patch extending through the barrier from the rear surface of the OLED and formed from a material having a thermal conductivity greater than the barrier on the rear surface, a thermal heat sink trace that leads from the feedthrough patch of the OLED to a fixture that receives the OLED assembly.

2. The OLED assembly of claim 1 wherein the OLED is encased in a barrier over a front surface of the OLED.

3. The OLED assembly of claim 1 wherein the feedthrough patch includes a metal.

4. The OLED assembly of claim 1 wherein the thermal management arrangement includes a high thermal conductivity adhesive.

5. The OLED assembly of claim 4 wherein the adhesive has a thermal conductivity ranging from approximately 1.0 W/(mK) to approximately 5.0 W/(mK).

6. The OLED assembly of claim 4 wherein the adhesive has a thickness of approximately 10-100 microns.

7. The OLED assembly of claim 4 wherein the adhesive can be used for at least one of connecting the OLED to the feedthrough patch extending through the barrier from the rear surface of the OLED, connecting the thermal heat sink trace leading from a central region of the OLED toward a perimeter region thereof to the feedthrough patch, or connecting the trace to a heat dissipating fixture.

8. The OLED assembly of claim 1 wherein the trace includes a thin layer of metal.

9. The OLED assembly of claim 8 wherein the thin layer metal trace is selected from the group of silicon (Si), tin (Sn), antimony (Sb), nickel (Ni), molybdenum (Mo), copper (Cu), aluminum (Al), silver (Ag), zinc (Zn), or mixtures, combinations, or alloys thereof, and has a thickness on the order of approximately 10-100 microns.

10. The OLED assembly of claim 8 wherein the thin layer conductive trace can be composed of at least one of graphite, graphene oxide ITO, halogenated tin oxide, and ZnO.

11. The OLED assembly of claim 8 wherein the thin layer conductive trace can be composed of at least one of graphite, graphene oxide ITO, halogenated tin oxide, ZnO and composite polystyrene.

12. The OLED assembly of claim 8 wherein the thin layer conductive trace can be composed of at least one of graphite, graphene oxide ITO, halogenated tin oxide, ZnO and composite polystyrene located adjacent to the metal trace.

13. A large area, flexible, organic light emitting device (OLED) assembly comprising:
a large area, flexible OLED; and
a thermal management arrangement for the OLED wherein the OLED is encased in a barrier over front and rear surfaces of the OLED, and further comprising a feedthrough patch extending through the barrier from the rear surface of the OLED and wherein a trace extends from the feedthrough patch to a heat sink fixture that receives the OLED assembly.

14. The OLED assembly of claim 13 wherein
the thermal management arrangement for the OLED includes a metal cathode having a thickness of at least approximately 500 nm, wherein the metal cathode has a rigidity modulus that ranges between approximately 15 and 110 GPa.

15. The OLED assembly of claim 14 wherein the thickness of the metal cathode is approximately 1000 nm.

16. The OLED assembly of claim 14 wherein the thickness of the metal cathode is no greater than approximately 2000 nm.

17. The OLED assembly of claim 14 wherein the OLED operates between a range from approximately 1 watt to less than 60 watts.

18. The OLED assembly of claim 17 wherein the operating power ranges from approximately 1 watt to approximately 10 watts.

19. The OLED assembly of claim 14 wherein the metal cathode has a thermal conductivity that ranges from approximately 20 (antimony) to 430 (silver) W/(mK).

20. The OLED assembly of claim 14 wherein the metal cathode includes metal selected from the group of silicon (Si), tin (Sn), antimony (Sb), nickel (Ni), molybdenum (Mo), copper (Cu), aluminum (Al), silver (Ag), zinc (Zn), or mixtures, combinations, or alloys thereof.

21. The OLED assembly of claim 14 wherein the metal cathode includes multiple materials.

22. The OLED assembly of claim 14 wherein the metal cathode is a bi-layer structure in which a first layer has a thickness of approximately 50 nm or less, and the thickness of the thermally conductive second layer is approximately 450 nm or greater, where the combined thicknesses of the two layers is approximately 500 nm or greater.

23. The OLED assembly of claim 22 wherein the first layer is one of aluminum or silver, and the second layer is the other of aluminum or silver, or one of silicon (Si), tin (Sn), antimony (Sb), nickel (Ni), molybdenum (Mo), copper (Cu), zinc (Zn), or mixtures, combinations, or alloys thereof.

24. The OLED assembly of claim 14 wherein the area of the OLED has a light emitting surface area greater than 70 $cm^2$.

25. The OLED assembly of claim 13 wherein the OLED is encased in a barrier over front and rear surfaces of the OLED and wherein the thermal management arrangement includes a thin, flexible plate exposed along a rear surface of the hermetically sealed OLED.

26. The OLED assembly of claim 25 wherein the plate includes a metal.

27. The OLED assembly of claim 26 wherein the plate metal is selected from the group of silicon (Si), tin (Sn), antimony (Sb), nickel (Ni), molybdenum (Mo), copper (Cu), aluminum (Al), silver (Ag), zinc (Zn), or mixtures, combinations, or alloys thereof, and has a thickness on the order of approximately 10-100 microns.

28. The OLED assembly of claim 25 wherein the plate has an exposed surface area that is at least 30% of the light emitting area.

* * * * *

UNITED STATES PATENT AND TRADEMARK OFFICE
CERTIFICATE OF CORRECTION

PATENT NO. : 8,829,556 B2  
APPLICATION NO. : 13/223935  
DATED : September 9, 2014  
INVENTOR(S) : Aurongzeb et al.

Page 1 of 1

It is certified that error appears in the above-identified patent and that said Letters Patent is hereby corrected as shown below:

In the Specification

In Column 2, Line 59, delete "he" and insert -- be --, therefor.

In Column 3, Line 35, delete "of he" and insert -- of the --, therefor.

In Column 5, Line 22, delete "126" and insert -- 126, --, therefor.

In Column 5, Line 64, delete "itself" and insert -- itself. --, therefor.

Signed and Sealed this  
First Day of September, 2015

Michelle K. Lee  
*Director of the United States Patent and Trademark Office*